United States Patent
Kim (10) Patent No.: US 7,397,095 B2
(45) Date of Patent: Jul. 8, 2008

(54) SEMICONDUCTOR DEVICE HAVING A DUAL GATE ELECTRODE AND METHODS OF FORMING THE SAME

(75) Inventor: Woo-Sik Kim, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 53 days.

(21) Appl. No.: 11/343,388

(22) Filed: Jan. 31, 2006

(65) Prior Publication Data

US 2006/0197165 A1    Sep. 7, 2006

(30) Foreign Application Priority Data

Feb. 1, 2005    (KR)    ............... 10-2005-0009147

(51) Int. Cl.
*H01L 29/78*    (2006.01)
(52) U.S. Cl. ...................... 257/412; 438/585
(58) Field of Classification Search ................. 257/412; 438/585
See application file for complete search history.

(56) References Cited

U.S. PATENT DOCUMENTS 6,727,130 B2    4/2004    Kim et al.
2004/0065930 A1*    4/2004    Lin et al. .................... 257/412

FOREIGN PATENT DOCUMENTS

| JP | 11-284179 | 10/1999 |
| JP | 2004-158593 | 6/2004 |
| KR | 10-0230749 | 8/1999 |
| KR | 20020080111 | * 4/2001 |
| KR | 1020020080111 | 10/2002 |

OTHER PUBLICATIONS

Notice to File a Response/Amendment to the Examination Report and English-language translation issued Sep. 22, 2006 in counterpart Korean application No. 10-2005-0009147.

* cited by examiner

*Primary Examiner*—Douglas M Menz
(74) *Attorney, Agent, or Firm*—Mills & Onello LLP (57) ABSTRACT

A semiconductor device having a dual gate electrode and a method of forming the same are provided. The semiconductor device includes a substrate including first and second regions. A first gate electrode formed of a first metal silicide is disposed on the substrate of the first region. A second gate electrode is disposed on the substrate of the second region. The second gate electrode is formed of a second metal silicide including a metal the same as that of the first metal silicide. A gate insulating layer is interposed between the substrate and the first gate electrode, and between the substrate and the second gate electrode. The gate insulating layer brings about a Fermi pinning effect increasing or decreasing intrinsic work functions of the first and second metal silicides. In this case, the first metal silicide is a lower silicon concentration than the second metal silicide so that the Fermi pinning effect provided to the first gate electrode is less effective than that provided to the second gate electrode.

26 Claims, 5 Drawing Sheets

Fig. 10

SEMICONDUCTOR DEVICE HAVING A DUAL GATE ELECTRODE AND METHODS OF FORMING THE SAME

CROSS-REFERENCE TO RELATED APPLICATIONS

This U.S. non-provisional patent application claims priority under 35 U.S.C. § 119 of Korean Patent Application 2005-09147 filed on Feb. 1, 2005, the entire contents of which are hereby incorporated by reference.

BACKGROUND OF THE INVENTION

The present invention is concerned with a semiconductor device and a method of forming the same, and more specifically relates to a semiconductor device having a dual gate and a method of forming the same.

In general, a CMOS (Complementary Metal Oxide Silicon) semiconductor device includes an NMOS (N-channel Metal Oxide Silicon) transistor and a PMOS (P-channel Metal Oxide Silicon) transistor. Electrons are accumulated in a channel of the NMOS transistor, and holes are accumulated in a channel of the PMOS transistor.

A method for forming gate electrodes of the NMOS and PMOS transistors with polysilicon doped with n-type impurities is disclosed. In accordance with this method, productivity can be improved by simplifying a fabrication process, but a channel of the PMOS transistor may be a buried channel because a work function of polysilicon doped with n-type impurities is close to a silicon conduction-band edge energy level. As a result, an operation speed of the PMOS transistor may be decreased.

With high integration of semiconductor devices, there has been an increasing need for a PMOS transistor and an NMOS transistor to be operated at high speed. To obtain PMOS and NMOS transistors with high speed and optimized characteristics, a PMOS gate electrode and an NMOS gate electrode are generated to have optimized work functions. That is, a work function of the NMOS gate electrode is close to a silicon conduction-band edge energy level, and a work function of the PMOS gate electrode is close to a silicon valence-band edge energy level. In this case, all channels of the NMOS and PMOS transistors may be formed of a surface channel. Accordingly, the NMOS and PMOS transistors can be operated at high speed.

Formation of an NMOS gate electrode with polysilicon doped with n-type impurities and a PMOS gate electrode with polysilicon doped with p-type impurities has been proposed. In this method, work functions of the PMOS and NMOS transistors are close to a silicon conduction-band edge energy level and a silicon valence-band edge energy level, respectively, so that they can be operated at high speed. In case where the NMOS and PMOS transistors are formed of polysilicon doped with n-type or p-type impurities, however, a depletion region is formed in the gate electrodes of the NMOS and PMOS transistors. As a result, operation speed of the NMOS and PMOS transistors may be decreased.

Thus, a semiconductor device having a dual gate electrode for optimizing characteristics, e.g., high-speed and/or low power consumption, of NMOS and PMOS transistors is being investigated very actively.

SUMMARY OF THE INVENTION

The invention provides a semiconductor device having a dual gate electrode capable of optimizing characteristics of NMOS and PMOS transistors and a method of forming the same.

The invention provides a semiconductor device having a dual gate electrode in which gate electrodes of NMOS and PMOS transistors have optimized work functions and a method of forming the same.

In one aspect, the present invention is directed to a semiconductor device. The device includes a substrate having first and second regions. A first gate electrode made of a first metal silicide is disposed on the substrate in the first region. A second gate electrode made of a second metal silicide including a metal the same as the metal of the first metal silicide is disposed on the substrate in the second region. A gate insulating layer is interposed between the substrate and the first gate electrode, and between the substrate and the second gate electrode. The gate insulating layer brings about a Fermi pinning effect for increasing or decreasing intrinsic work functions of the first and second metal silicides. In this case, the first metal silicide has a lower silicon concentration than the second metal silicide so that the Fermi pinning effect provided to the first gate electrode is less effective than that provided to the second gate electrode.

In one embodiment, the first region is a region in which a PMOS transistor is formed, and the second region is a region in which an NMOS transistor is formed. Preferably, the gate insulating layer brings about a Fermi pinning effect for decreasing intrinsic work functions of the first and second metal silicides. Also, an intrinsic work function of a metal included in the first and second metal silicides is larger than that of the first and second metal silicides. It is preferable that the metal included in the first and second metal silicides be one of nickel, cobalt, and platinum. Also, the gate insulating layer brining about the Fermi pinning effect for decreasing the work function includes at least one of hafnium oxide, hafnium silicate, zirconium oxide, and zirconium oxide.

In another embodiment, the first region is a region in which an NMOS transistor is formed, and the second region is a region in which a PMOS transistor is formed. Preferably, the gate insulating layer brings about a Fermi pinning effect for increasing intrinsic work functions of the first and second metal silicides. Also, an intrinsic work function of a metal included in the first and second metal silicides is smaller than that of the first and second metal silicides. In this case, it is preferable that the metal included in the first and second metal silicides be one of tantalum and molybdenum. Also, the gate insulating layer bringing about the Fermi pinning effect for decreasing the work function includes at least one of aluminum oxide and aluminum silicate.

In another embodiment, an upper surface of the first gate electrode may be lower that that of the second gate electrode. The semiconductor device may further include a mold insulating layer enclosing sidewalls of the first and second gate electrodes. The upper surface of the first gate electrode may be lower than that of the mold insulating layer, and the upper surface of the second gate electrode may be higher than that of the mold insulating layer. Alternatively, upper surfaces of the first and second gate electrodes may be higher than that of the mold insulating layer. The semiconductor device may further include first source/drain regions formed on the substrate in the first region at both sides of the first gate electrode and second source/drain regions formed on the substrate in the second region at both sides of the second gate electrode.

In another aspect, the present invention is directed to a method of forming a semiconductor device. According to the method, a substrate including first and second regions is provided, and a gate insulating layer is formed on a surface of the substrate. A first gate electrode made of a first metal silicide is formed on the gate insulating layer of the first region. A second gate electrode made of a second metal silicide including a metal the same as that of the first metal silicide is formed on the gate insulating layer of the second region. The gate insulating layer is formed of an insulating material bringing about Fermi pinning effect for increasing or decreasing an intrinsic work function of the first and second metal silicides. The first metal silicide has a lower silicon concentration than the second metal silicide so that the Fermi pinning effect provided to the first gate electrode is less effective than that provided to the second gate electrode.

In one embodiment, the first region is a region in which a PMOS transistor region is formed, and the second region is a region in which an NMOS transistor region is formed. The gate insulating layer is formed of an insulating material bringing about Fermi pinning effect for decreasing intrinsic work functions of the first and second metal silicides. In this case, it is preferable that an intrinsic work function of a metal included in the first and second metal silicides be larger than that of the first and second metal silicides.

In another embodiment, the first region is a region in which an NMOS transistor region is formed, and the second region is a region in which a PMOS transistor region is formed. Preferably, the gate insulating layer is formed of an insulating material bringing about Fermi pinning effect for increasing intrinsic work functions of the first and second metal silicides. In this embodiment, an intrinsic work function of a metal included in the first and second metal silicides is smaller than that of the first and second metal silicides.

In another embodiment, the steps for forming the first and second gate electrodes may further include the following steps. A first silicon pattern is formed on the gate insulating layer of the first region, and a second silicon pattern is formed on the gate insulating layer of the second region. A mold insulating layer enclosing the first and second silicon patterns is formed on the substrate. Upper surfaces of the first and second silicon patterns are exposed. The exposed first silicon pattern is selectively recessed, and a metal layer is deposited on a surface of the substrate. The first gate electrode is formed by reacting all recessed first silicon patterns and the metal layer through a complete silicidation process. A second gate electrode is formed by reacting all recessed second silicon patterns and the metal layer through a complete silicidation process. The unreacted metal layer is removed.

In another embodiment, the step for forming the first and second gate electrodes may further include the followings steps. A first silicon pattern is formed on the gate insulating layer of the first region and a second silicon pattern is formed on the gate insulating layer of the second region. A mold insulating layer enclosing the first and second silicon patterns is formed on the substrate, and upper surfaces of the first and second silicon patterns are exposed. A metal layer and a subsidiary silicon layer are deposited on a surface of the substrate sequentially. The subsidiary silicon layer of the first region is removed, and the subsidiary silicon layer on the metal layer of the second region remains. The first gate electrode is formed by reacting all first silicon patterns and the metal layer through a complete silicidation process. A second gate electrode is formed by reacting the second silicon patterns, the subsidiary silicon layer and the metal layer through a complete silicidation process. An unreacted metal layer of the first region is removed, and a residual material formed by the reaction of the metal layer and the subsidiary silicon layer on the mold insulating layer of the second region is removed.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

DETAILED DESCRIPTION OF PREFERRED EMBODIMENTS

Figure 1:
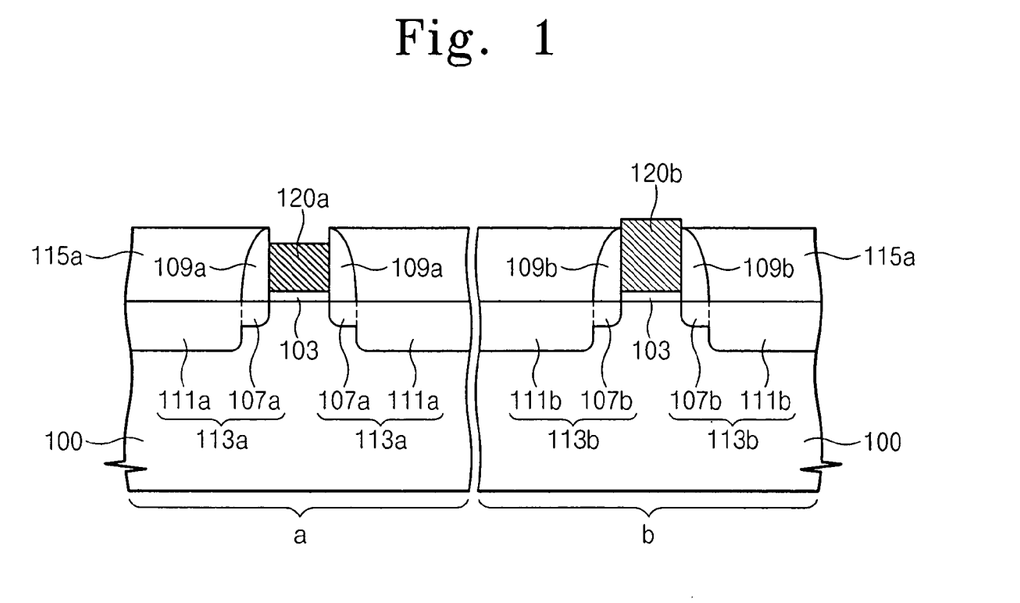
FIG. 1 is a cross-sectional view showing a semiconductor device in accordance with an embodiment of the present invention.
Figure 2:
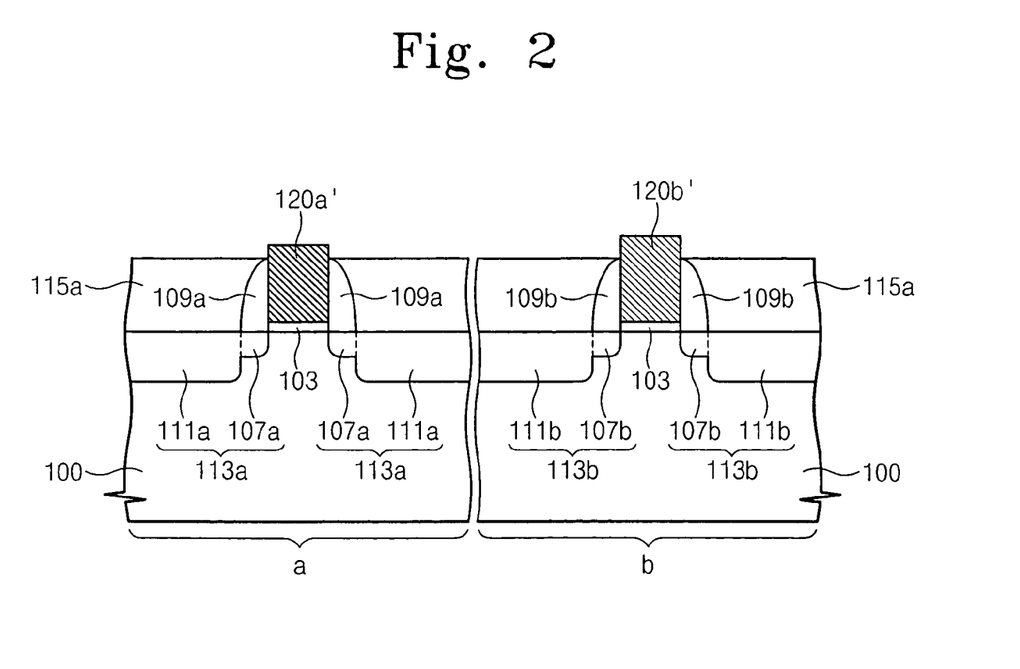
FIG. 2 is a cross-sectional view showing a modification embodiment of the embodiment of the present invention shown in FIG. 1.

FIG. 1 is a cross-sectional view showing a semiconductor device according to an embodiment of the present invention. FIG. 2 is a cross-sectional view showing an embodiment of the present invention representing a modification of the embodiment of FIG. 1.

Referring to FIG. 1, a substrate 100 has a first region a and a second region b. One of the first and second regions a and b is a region in which an NMOS transistor is formed, and the other is a region in which a PMOS transistor is formed.

A first gate electrode 120a is disposed on the substrate 100 of the first region a, and a second gate electrode 120b is disposed on the substrate 100 of the second region. A gate insulating layer 103 is interposed between the first gate electrode 120a and the substrate 100, and the second gate electrode 120b and the substrate 100.

The first gate electrode 120a is formed of a first metal silicide, and the second gate electrode 120b is formed of a second metal silicide. The first and second metal suicides include the same metallic elements. Also, the first and second metal silicides include silicon elements. In this case, the first and second metal suicides have different silicon concentration. The silicon concentration of the first metal silicide is lower than that of the second metal silicide. That is, the metal concentration of the first metal silicide is higher than that of the second metal silicide.

The gate insulating layer 103 brings about a Fermi pinning effect for increasing or decreasing intrinsic work functions of the first and second metal suicides. The Fermi pinning effect is caused by interface states between the gate insulating layer 103 and the gate electrodes 120a and 120b. The interface states are created from the combination of specific elements in the gate insulating layer 103 and silicon elements in the gate electrodes 120a and 120b. As a density of the interface states is increased, the Fermi pinning effect is more effective. Otherwise, the Fermi pinning effect becomes weak. The density of the interface states is proportional to a silicon concentration. That is, the higher the silicon concentration in the gate electrodes 120a and 120b is, the higher the density of the interface state is. In contrast, the lower the silicon concentration in the gate electrodes 120a and 120b, the lower the density of the interface states is. Since the silicon concentration of the first metal silicide is lower than that of the second metal silicide, the Fermi pinning effect provided to the first gate electrode 120a by the gate insulating layer 103 is less than that provided to the second gate electrode 120b by the gate insulating layer 103. Consequently, a variation of the intrinsic work function of the first metal silicide by the Fermi pinning effect is smaller than that of the second metal silicide.

Preferably, the intrinsic work function of the first and second metal silicides is between a silicon conduction-band edge energy level (approximately 4.01 eV) and a silicon valence-band edge energy level (approximately 5.13 eV).

An embodiment of the present invention will be described for a case in which the first region a is the PMOS region, and the second region b is the NMOS region. In this case, the work function of the first gate electrode 120a is close to the silicon valence-band edge energy level in comparison with the work function of the second gate electrode 120b, and the work function of the second gate electrode 120b is close to the energy level at the silicon conduction-band edge energy level in comparison with the work function of the first gate electrode 120a. That is, the work function of the first gate electrode 120a is larger than that of the second gate electrode 120b.

In the case in which the first and second regions a and b are the NMOS and PMOS regions, it is preferable that the gate insulating layer 103 bring about Fermi pinning effect for decreasing intrinsic work functions of the first and second metal silicides. The work function of the first gate electrode 120a having a relatively weak Fermi pinning effect is larger than that of the second gate electrode 120b having a relatively strong Fermi pinning effect. That is, the first gate electrode 120a has a work function close to a silicon valence-band edge energy level as compared with the second gate electrode 120b, and the second gate electrode 120b has a work function close to a silicon conduction-band edge energy level as compared with the second gate electrode 120b. As a result, a PMOS transistor at the first region a and an NMOS transistor at the second region b have an optimized threshold voltage. Accordingly, it is possible to embody NMOS and PMOS transistors.

Preferably, the gate insulating layer 103 bringing about the Fermi pinning effect for decreasing the work function includes at least one material selected from the group consisting of hafnium oxide, hafnium silicate, zirconium oxide, and zirconium silicate. The interface states generated from the combination of hafnium and/or zirconium elements and silicon elements in the first and second metal silicides have the Fermi pinning effect for decreasing the work function. Also, since an insulating layer including hafnium or zirconium has a high dielectric constant, the gate insulating layer has a high dielectric constant. Thus, a leakage current characteristic as well as an operation speed of the NMOS and PMOS transistors are improved.

In the case iin which the first and second regions a and b are PMOS and NMOS regions, respectively, an intrinsic work function of a metal included in the first and second metal suicides is preferably larger than that of first and second metal silicides. That is, it is preferable that an intrinsic work function of pure metal be larger than that of metal silicide. In particular, an intrinsic work function of the metal included in the first and second metal silicides is close to a silicon valence-band edge energy level. Accordingly, the intrinsic work function of the first metal silicide having high metal concentration is higher than that of the second metal silicide. As a result, the work function of the first gate electrode 120a can be close to the silicon valence-band edge energy level. For example, it is preferable that the metal included in the first and second metal silicides be one of nickel, cobalt, and platinum.

An intrinsic work function of nickel and nickel silicide NiSi is approximately 5.22 eV and 4.6 eV, respectively. An intrinsic work function of cobalt and cobalt silicide $CoSi_2$ is approximately 5.0 eV and 4.52 eV, respectively. An intrinsic work function of platinum and nickel silicide $PtSi_2$ is approximately 5.34 eV and 4.62 eV, respectively.

An embodiment of the present invention will be described in the case in which the gate insulating layer 103 is formed of hafnium silicate for generating Fermi pinning effect for decreasing the work function, and the first and second metal silicides include nickel. Owing to low silicon concentration, the Fermi pinning effect for decreasing the work function provided to the first gate electrode 120a is less than that of the second gate electrode 120b. For this reason, the first gate electrode 120a is close to the energy level at the silicon valence-band edge energy level as compared with the second gate electrode 120b, and the second gate electrode 120b is close to the silicon conduction-band edge energy level as compared with the first gate electrode 120a. Since the intrinsic work function of the first metal silicide having a relatively high nickel concentration is higher than that of the second metal silicide, the first gate electrode 120 is closer to the silicon valence-band edge energy level.

Next, another embodiment of the present invention will be described in a case in which the first region a is the NMOS region, and the second region b is the PMOS region. In this case, the first gate electrode 120a is close to the silicon conduction-band edge energy level as compared with the second gate electrode 120b, and the second gate electrode 120b is close to the silicon valence-band edge energy level as compared with the first gate electrode 120a. That is, the work function of the first gate electrode 120a is smaller than that of the second gate electrode 120b.

In the case in which the first and second regions a and b are NMOS and PMOS regions, respectively, it is preferable that the gate insulating layer 103 bring about the Fermi pinning effect for increasing intrinsic work functions of the first and second metal silicides. For instance, it is preferable that the gate insulating layer 103 include at least one of aluminum oxide and aluminum silicate. The interface states generated from the combination of aluminum elements and the silicon elements in the first and second metal silicides have Fermi pinning effect for increasing the work function. Since the first metal silicide has a lower silicon concentration in comparison with the second metal silicide, the Fermi pinning effect for increasing the work function provided to the first gate electrode 120a is less than that provided to the second gate electrode 120b. As a result, the first gate electrode 120a is close to the silicon conduction-band edge energy level in comparison with the second gate electrode 120b, and the second gate electrode 120b is close to the silicon valence-band edge energy level band in comparison with the first gate electrode 120a. That is, the work function of the first gate electrode 120a is smaller than that of the second gate electrode 120b. Accordingly, the NMOS transistor at the first region a and the PMOS transistor at the second region b have optimized threshold voltage so that they can be operated at a high speed. In addition, the aluminum oxide and aluminum silicate have high dielectric constant, thereby increasing dielectric constant of the gate insulating layer 103. Thus, it is possible to improve leakage current characteristics as well as operation speed of the NMOS and PMOS transistors.

In the case in which the first and second regions a and b are NMOS and PMOS transistors, respectively, it is preferable that an intrinsic work function of a metal included in the first and second metal suicides be smaller than that of the first and second metal suicides. In particular, it is preferable that an intrinsic work function of the metal included in the first and second metal suicides be close to the silicon conduction-band edge energy level. Thus, the first metal silicide having a relatively high metal concentration has a small work function as compared with the second metal silicide. Consequently, the work function of the first gate electrode 120a can be closer to the silicon conduction-band edge energy level. For example, it is preferable that the metal included in the first and second metal suicides be one of tantalum and molybdenum.

An intrinsic work function of tantalum is approximately 4.15 eV, and an intrinsic work function of tantalum silicide $TaSi_2$ is approximately 4.35 eV. An intrinsic work function of molybdenum is approximately 4.2 eV, and an intrinsic work function of molybdenum silicide $MoSi_2$ is approximately 4.35 eV.

An embodiment of the present invention will be described in the case ini which the gate insulating layer 103 is formed of aluminum silicate bringing about the Fermi pinning effect for increasing the work function, and the first and second metal silicides include molybdenum. Due to low silicon concentration, the Fermi pinning effect increasing the work function provided to the first gate electrode 120a is less than that provided to the second electrode 120b. As such, the first gate electrode 120a is close to the silicon conduction-band edge energy level as compared with the second gate electrode 120b, and the second gate electrode 120b is close to the silicon valence-band edge energy level band as compared with the first gate electrode 102a. Also, because an intrinsic work function of the first metal silicide having a relatively high molybdenum concentration is smaller that that of the second metal silicide, the first gate electrode 120a is closer to the silicon conduction-band edge energy level.

Referring still to FIG. 1, a first source/drain region 113a is disposed in a substrate 100 of the first region a at both sides of the first gate electrode 120a. If the first region a is the PMOS region, the first source/drain region 113a is doped with p-type impurities. If the first region a is the NMOS region, the first source/drain region 113a is doped with n-type impurities. The first source/drain region 113a includes a first shallow doped layer 107a and a first deep doped layer 111a. The first shallow doped layer 107a is located between the first channel region defined by the first gate electrode 120a and the first deep doped layer 111a. The first source/drain region 113a may be a LDD structure or extended source/drain structure, which comprise the first shallow doped layer 107a and the first deep doped layer 111a.

A second source/drain region 113b is disposed in the substrate 100 of the second region b at both sides of the second gate electrode 120b. If the second region b is the NMOS region, the second source/drain region 113b is doped with n-type impurities. If the second region b is the PMOS region, the second source/drain region 113b is doped with p-type impurities. The second source/drain region 113b may be a LDD structure or extended source/drain structure, which comprise the second shallow doped layer 107b and the second deep doped layer 111b. The second shallow doped layer is located between a second channel region defined by the second gate electrode 120b and the second deep doped layer 111b.

The first and second source/drain regions 113a and 113b are doped with impurities of different types, respectively.

First and second spacers 109a and 109b are located at both sides of the first and second gate electrodes 120a and 120b, respectively. The first and second spacers 109a and 109b may be formed of the same materials. For instance, the first and second spacers 109a and 109b may include at least one of silicon oxide, silicon nitride, and silicon oxynitride.

A mold insulating layer 115a enclosing sidewalls of the first and second gate electrodes 120a and 120b is located on the substrate 100. The spacers 109a and 109b are located between the gate electrodes 120a and 120b and the mold insulating layer 115a. The mold insulating layer 115a has the same height as the tops of the spaces 109a and 109b. The mold insulating layer 115a may be formed of silicon oxide.

An upper surface of the first gate electrode 120a may be lower than that of the second gate electrode 120b. As shown in FIG. 1, the upper surface of the first gate electrode 120a is lower than that of the mold insulating layer 115a. The upper surface of the second gate electrode 120b may be lower than that of the mold insulating layer 115a.

A modification of the semiconductor device according to the present invention of FIG. 1 is shown in FIG. 2. That is, FIG. 2 is a cross-sectional view of another embodiment of the invention which represents a modification of the embodiment of FIG. 1.

Referring to FIG. 2, the configuration of first and second gate electrodes 120a' and 120b' is the distinctive characteristic of the modified embodiment. In more detail, upper surfaces of the first and second gate electrodes 120a' and 120b' may be higher than the upper surface of the mold insulating layer 115a. That is, upper portions of the first and second gate electrodes 120a' and 120b' may protrude over the mold insulating layer 115a. As shown in FIG. 2, the upper surface of the first gate electrode 120a' is lower than that of the second gate electrode 120b'.

Another characteristic of the first and second gate electrodes 120a' and 120b' is the same as that of the first and second gate electrode 120a and 120b. Specifically, the first and second gate electrodes 120a' and 120b' are formed of the same material as the first and second gate electrodes 120a and 120b.

FIGS. 3 to 7 are cross-sectional views illustrating a method for forming a semiconductor device according to an embodiment of the present invention.

Figure 3:
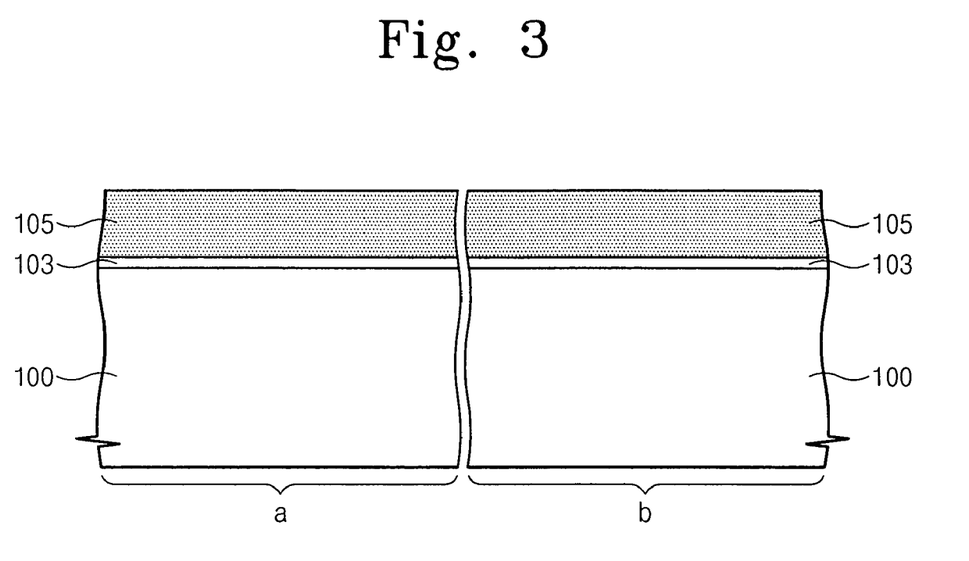
FIGS. 3 to 7 is are cross-sectional views illustrating a method of forming the semiconductor device in accordance with an embodiment of the present invention.

Referring to FIG. 3, a substrate 100 including a first region a and a second region b is provided. One of the first and second regions a and b is an NMOS region in which an NMOS transistor is formed, and the other region is a PMOS region in which a PMOS transistor is formed.

A gate insulating layer 103 and a silicon layer 105 are sequentially formed on an entire surface of the substrate 100. The silicon layer 105 may be formed of polysilicon or amorphous silicon.

Figure 4:
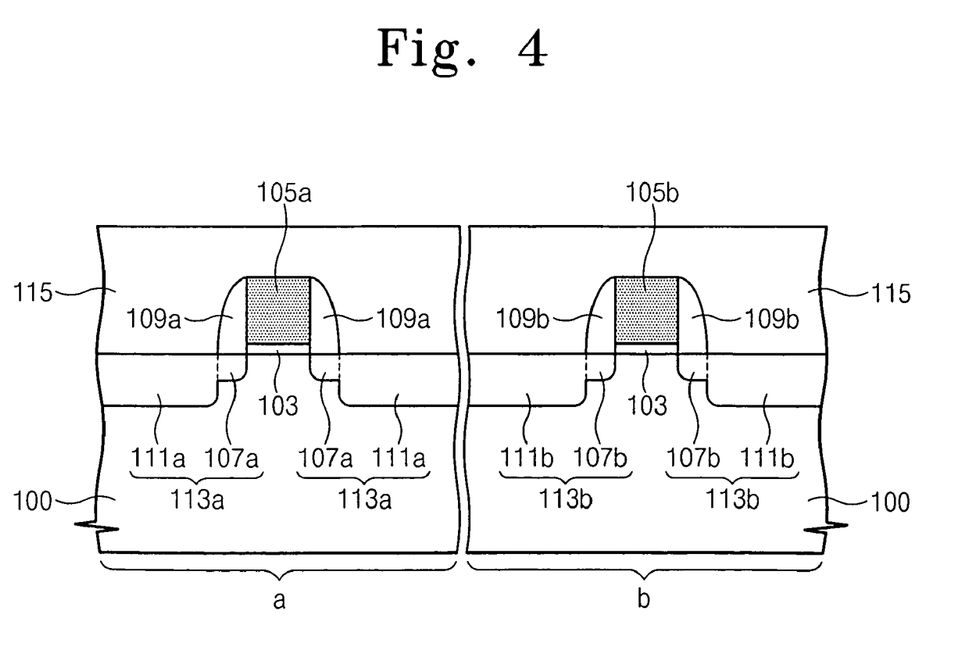

Referring to FIG. 4, the silicon layer 105 is patterned to form a first silicon pattern 105a on the gate insulating layer 103 of the first region a and a second silicon pattern 105b on the gate insulating layer 103 of the second region b.

The portion of the gate insulating layer 103 formed on the substrate 100 at both sides of the first and second silicon patterns 105a and 105b may be removed in a subsequent process.

A first shallow doped layer 107a is formed by selectively implanting first impurity ions into the substrate 100 of the first region a using the first silicon pattern 105a as a mask. A second shallow doped layer 107b is formed by selectively implanting second impurity ions into the substrate 100 of the second region b using the second silicon pattern 105b as a mask.

A spacer insulating layer is conformally formed on an entire surface of the substrate 100. First and second spacers 109a and 109b are formed at both sidewalls of the first and second silicon patterns 105a and 105b by anisotropically etching back the spacer insulating layer. The spacer insulating layer may include at least one of silicon oxide, silicon nitride, and silicon oxynitride.

A first deep doped layer 111a is formed by selectively implanting impurity ions of first conductivity type into the substrate 100 of the first region a using the first silicon pattern 105a and the first spacer 109a as a mask. A second deep doped layer 111b is formed by selectively implanting impurity ions of second conductivity type into the substrate 100 of the second region b using the second silicon pattern 105b and the second spacer 109b as a mask.

A first source/drain region 113a includes the first shallow doped region 107a and the first deep doped region 111a. The second source/drain region 113b includes the second shallow doped region 107a and the second deep doped layer 111b.

A mold insulating layer 115 is formed on an entire surface of the substrate 100. The mold insulating layer 115 may be formed of silicon oxide.

Figure 5:
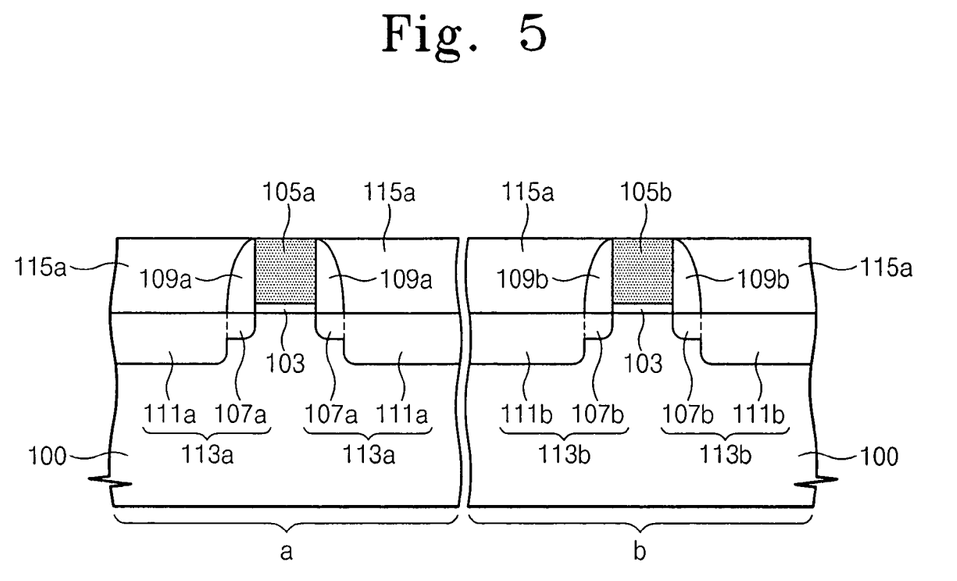

Referring to FIG. 5, the mold insulating layer 115 is planarized until the first and second silicon patterns 105a and 105b are exposed. As such, an upper surface of the planarized mold insulating layer 115a may have the same height as the tops of the spacers 109a and 109b.

Figure 6:
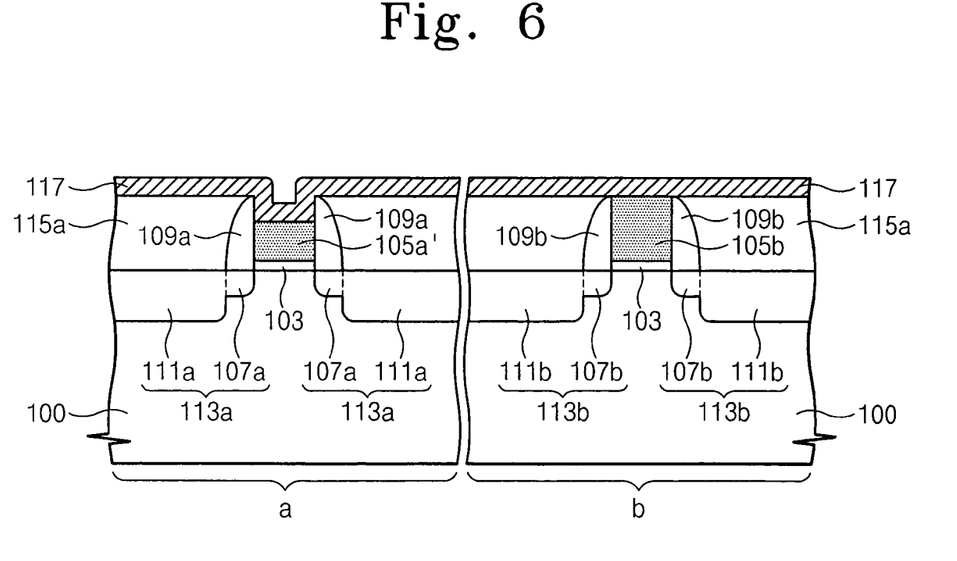
Figure 7:
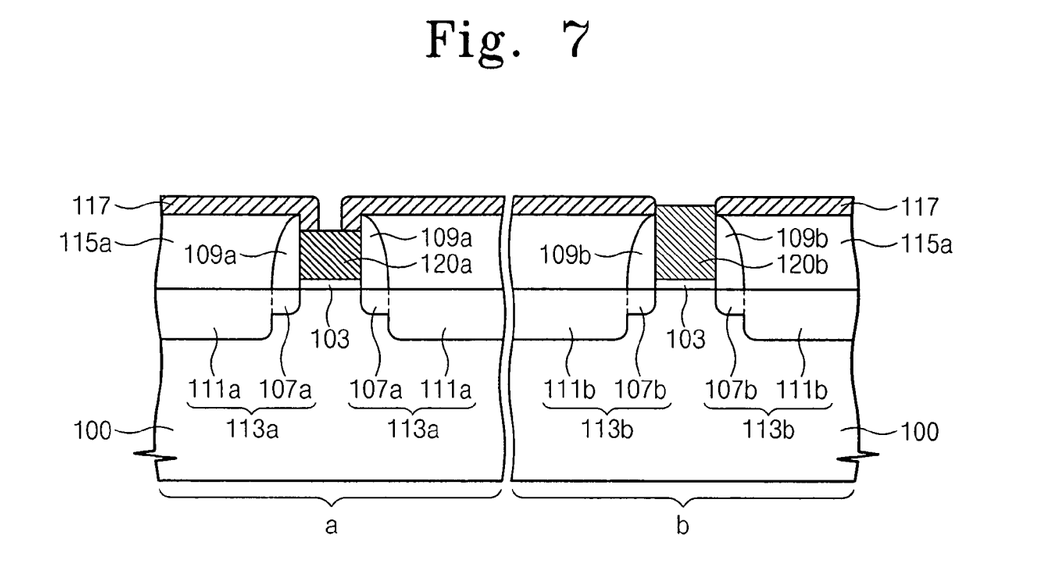

Referring to FIGS. 6 and 7, the first silicon pattern 105a is selectively recessed using a mask pattern (not shown) covering the second silicon pattern 105b. An upper surface of the first recessed silicon pattern 105a' is lower than that of the planarized mold insulating layer 115a.

A metal layer 117 is deposited on an entire surface of the substrate 100 including the first recessed silicon pattern 105a' and the second silicon pattern 105b.

Subsequently, a complete silicidation process is performed. The complete silicidation process may be an annealing process. According to the complete silicidation process, a first metal silicide is formed on the first gate insulating layer 103 of the first region a by reacting all of the recessed first silicon pattern 105a' and the metal layer 117. The first metal silicide makes up the first gate electrode 120a. Also, a second metal silicide is formed on the first gate insulating layer 103 of the second region b by reacting all of the recessed second silicon pattern 105b' and the metal layer 117.

During the complete silicidation process, the first recessed silicon pattern 105a' has a smaller volume than the second silicon pattern 105b'. Accordingly, the amount of the silicon elements supplied to the first metal silicide is smaller than that supplied to the second metal silicide. As a result, the first metal silicide has a lower silicon concentration than the second metal silicide. That is, the first metal silicide has a higher metal concentration than the second metal silicide. Owing to the heights of the recessed first and second silicon patterns 105a' and 105b, an upper surface of the first gate electrode 120a may be lower than that of the second gate electrode 120b. Owing to the recessed first silicon pattern 105a', in particular, an upper surface of the first gate electrode 120a may be lower than that of the mold insulating layer 115a.

The gate insulating layer 103 is formed of insulating materials bringing about the Fermi pinning effect for increasing or decreasing intrinsic work functions of the first and second metal silicides.

When the first region a is a PMOS region, and the second region b is an NMOS region, it is preferable that the gate insulating layer 103 be formed of insulating materials bringing about the Fermi pinning effect for decreasing intrinsic work functions of the first and second metal suicides. For instance, the gate insulating layer 103 preferably includes at least one of hafnium oxide, hafnium silicate, zirconium oxide, and zirconium silicate. In this case, an intrinsic work function of a metal included in the first and second metal suicides is preferably larger than that of the first and second metal silicides. That is, it is preferable that the metal layer 117 be formed of a metal having a larger work function than the intrinsic work function of the first and second metal silicides. For example, the metal layer 117 is formed of one of nickel, cobalt, and platinum. Accordingly, the first and second metal silicides include one of nickel, cobalt, and platinum.

When the first region a is the NMOS region, and the second region b is the PMOS region, the gate insulating layer 103 is formed of insulating materials bringing about the Fermi pinning effect for increasing intrinsic work functions of the first and second metal silicides. For instance, the gate insulating layer 103 is preferably formed of at least one of aluminum oxide and aluminum silicate. In this case, an intrinsic work function of the metal included in the first and second metal silicides is smaller that that of the first and second metal silicides. That is, it is preferable that the metal layer 117 be formed of a metal having a smaller work function than the intrinsic work function of the first and second metal silicides. For example, the metal layer 117 is formed of one of tantalum and molybdenum. As such, the first and second metal silicides include one of tantalum and molybdenum.

After forming the first and second gate electrodes 120a and 120b, unreacted metal layer 117 remaining on the upper surface of the planarized mold insulating layer 115a is removed, thereby embodying the semiconductor device of FIG. 1.

A process for depositing the metal layer 117 and complete silicidation process can be carried out sequentially, and, alternatively, can be carried in an in-situ manner.

Next, a modification embodiment of the method for forming the semiconductor device will be described.

Figure 8:
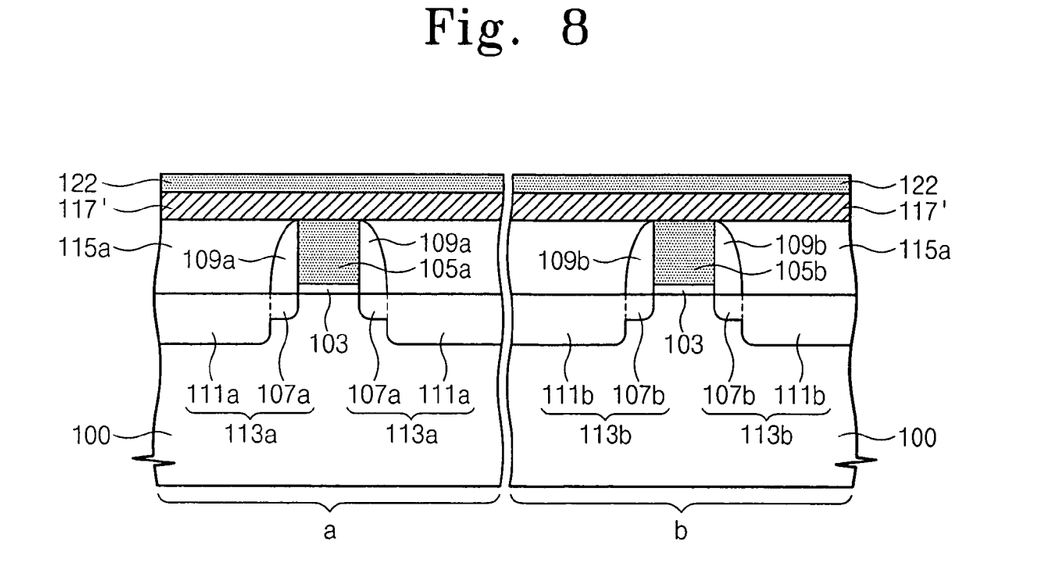
FIGS. 8 to 10 cross-sectional views showing a modification embodiment of a method of forming the semiconductor device in accordance with an embodiment of the present invention.
Figure 9:
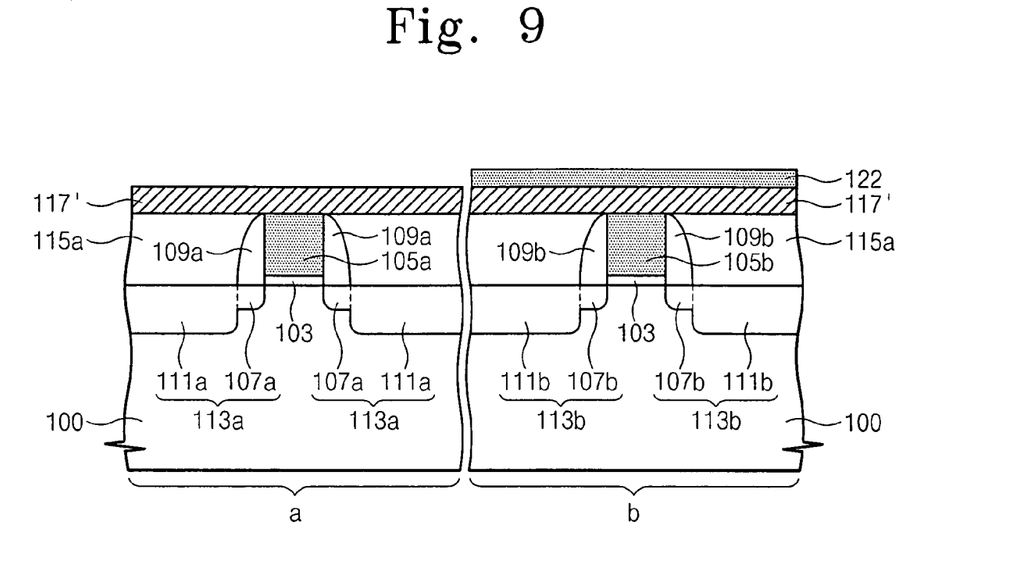
Figure 10:
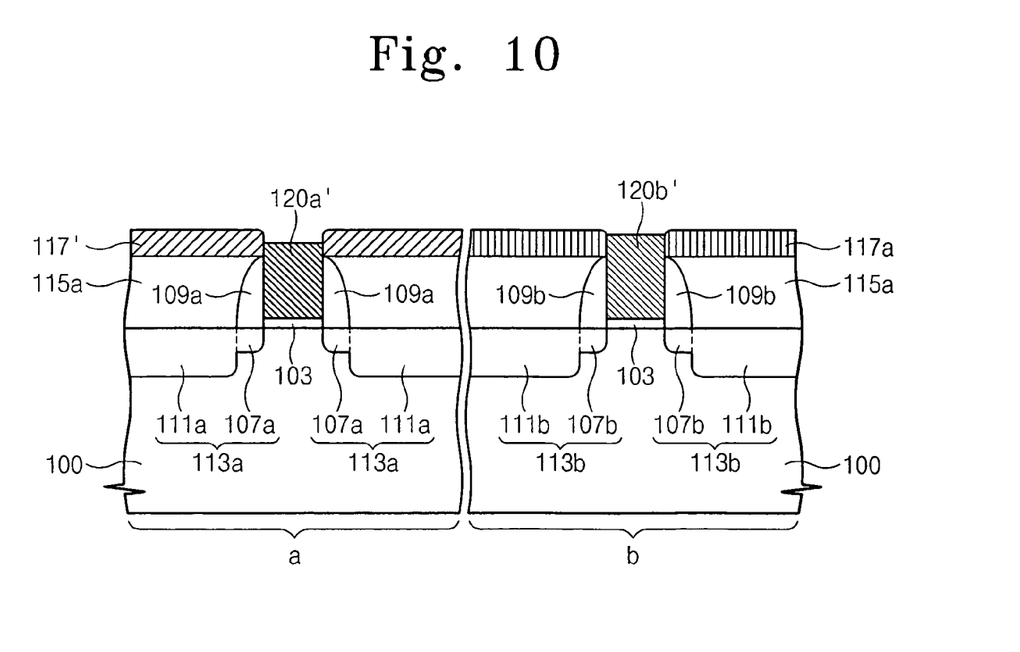

FIGS. 8 to 10 are cross-sectional views illustrating another embodiment of the method for forming the semiconductor device according to the present invention. The embodiment of FIGS. 8 to 10 represents a modification of the embodiment described above in connection with FIGS. 3 to 7.

Referring to FIGS. 8 to 10, the method of FIGS. 8 to 10 may include the method steps illustrated in FIGS. 3 to 5.

A metal layer 117' and a subsidiary silicon layer 122 are sequentially formed on an entire surface of the substrate 100 including exposed first and second silicon patterns 105a and 105b. The metal layer may be relatively thick in comparison with the metal layer 117 of FIG. 6. The metal layer 117' is formed of the same material as the metal layer 117 of FIG. 6. The subsidiary silicon layer 122 may be formed of polysilicon or amorphous silicon.

Referring to FIG. 9, the subsidiary silicon layer 122 of the first region a is selectively removed. In this case, the subsidiary silicon layer 122 of the second region b remains.

Referring to FIG. 10, a complete silicidation process is performed on an entire surface of the substrate 100. The complete silicidation process, as mentioned above, may be an annealing process. According to the complete silicidation process, a first metal silicide is formed on the gate insulating layer 103 of the first region a by reacting all of the first silicon patterns 105a and the metal layer 117'. The first metal silicide makes up a first gate electrode 120a'. Also, a second metal silicide is formed on the gate insulating layer 103 of the second region a by reacting all of the second silicon patterns 105b, the metal layer 117' and the subsidiary silicon layer 122. The second metal silicide makes up a second gate electrode 120b'.

In the above-described method, the first silicon pattern 105a is supplied as a silicon source to the first metal silicide. In contrast, the second silicon pattern 105b as well as partial subsidiary silicon layer 122 is supplied as a silicon source to the second metal silicide. For this reason, a silicon concentration of the first metal silicide is lower than that of the second metal silicide. That is, a metal concentration of the first metal silicide is higher than that of the second metal silicide.

Upper surfaces of the first and second gate electrodes 120a' and 120b' may protrude over the planarized mold insulating layer. In this case, the upper surface of the first gate electrode 120a may be lower than that of the second gate electrode 120b'.

Unreacted metal layer 117' remains on an upper surface of the planarized mold layer 115a of the first region a. In contrast, residual material 117a from the reaction of the subsidiary silicon layer 122 and the metal layer 117' remains on the upper surface of the planarized mold layer 115a of the second region b. The residual material 117a is formed of a third metal silicide. In this case, the concentration of the residual material 117a is very high. The metal concentration of the residual material 117a is higher than that of the first gate electrode 120a'. Accordingly, the residual material 117a has an etch selectivity with respect to the first and second gate electrodes 120a' and 120b'.

Thus, the unreacted metal layer 117' of the first region a and the residual material 117a of the second region b are removed, thereby embodying the semiconductor device of FIG. 2.

As previously described, a gate insulating layer brings about the Fermi pinning effect for increasing or decreasing intrinsic work functions of first and second metal silicides, which make up first and second gate electrodes. The first and second metal silicides include the same material. The first metal silicide has a lower silicon concentration than the second metal silicide. Accordingly, the Fermi pinning effect provided to the first gate electrode by the gate insulating layer is less than that provided to the second gate electrode by the gate insulating layer. As a result, one of the first and second gate electrodes is close to a silicon valence-band edge energy level, and the other is close to a silicon conduction-band edge energy level. Thus, NMOS and PMOS transistors may have optimized threshold voltages, respectively.

In addition, an intrinsic work function of a metal included in the first and second metal silicides is larger or smaller than that of the first and second metal silicides. As such, one of the first and second gate electrodes may be closer to the energy level at a silicon valence-band edge energy level or the silicon conduction-band edge energy level. As a result, NMOS and PMOS transistors may have optimized threshold voltages, respectively.

As a result, NMOS and PMOS transistors may have optimized characteristics such as high speed operation.

While this invention has been particularly shown and described with references to preferred embodiments thereof, it will be understood by those skilled in the art that various changes in form and details may be made herein without departing from the spirit and scope of the invention as defined by the appended claims.

What is claimed is:

1. A semiconductor device comprising:
a substrate including first and second regions;
a first gate electrode disposed on the substrate in the first region and formed of a first metal silicide;
a second gate electrode disposed on the substrate in the second region and formed of a second metal silicide including the same metal as that of the first metal silicide; and
a gate insulating layer interposed between the substrate and the first gate electrode, and between the substrate and the second gate electrode, wherein the gate insulating layer brings about a Fermi pinning effect increasing or decreasing an intrinsic work function of the first and second metal silicides, and wherein the first gate electrode formed of the first metal silicide has a height that is less than a height of the second gate electrode formed of the second metal silicide, such that the first metal silicide has a lower silicon concentration than the second metal silicide so that the Fermi pinning effect provided to the first gate electrode is less effective than that provided to the second gate electrode.

2. The semiconductor device as set forth in claim 1, wherein the first region is a region in which a PMOS transistor region is formed, and the second region is a region in which an NMOS transistor region is formed, and wherein the gate insulating layer brings about a Fermi pinning effect decreasing intrinsic work functions of the first and second metal silicides.

3. The semiconductor device as set forth in claim 2, wherein an intrinsic work function of a metal included in the first and second metal silicides is larger than that of the first and second metal suicides.

4. The semiconductor device as set forth in claim 3, wherein the metal included in the first and second metal silicides is one of nickel, cobalt, and platinum.

5. The semiconductor device as set forth in claim 2, wherein the gate insulating layer includes at least one material selected from the group consisting of hafluium oxide, hafnium silicate, zirconium oxide, and zirconium silicate.

6. The semiconductor device as set forth in claim 1, wherein the first region is a region in which an NMOS transistor region is formed, and the second region is a region in which a PMOS transistor region is formed, and wherein the gate insulating layer brings about a Fermi pinning effect increasing intrinsic work functions of the first and second metal silicides.

7. The semiconductor device as set forth in claim 6, an intrinsic work function of a metal included in the first and second metal silicides is smaller than that of the first and second metal silicide.

8. The semiconductor device as set forth in claim 7, wherein the metal included in the first and second metal silicides is one of tantalum and molybdenum.

9. The semiconductor device as set forth in claim 6, wherein the gate insulating layer includes at least one material selected from the group consisting of aluminum oxide and aluminum silicate.

10. The semiconductor device as set forth in claim 1, an upper surface of the first gate electrode is lower than that of the second gate electrode.

11. The semiconductor device as set forth in claim 10, further comprising a mold insulating layer enclosing sidewalls of the first and second gate electrodes.

12. The semiconductor device as set forth in claim 11, wherein the upper surface of the first gate electrode is lower than that of the mold insulating layer, and wherein the upper surface of the second gate electrode is higher than that of the mold insulating layer.

13. The semiconductor device as set forth in claim 11, wherein the upper surfaces of the first and second gate electrodes are higher than that of the mold insulating layer.

14. The semiconductor device as set forth in claim 1, further comprising:
first source/drain regions formed on the substrate in the first region at both sides of the first gate electrode; and
second source/drain regions formed at the substrate of the second region at both sides of the second gate electrode.

15. The semiconductor device as set forth in claim 1, wherein the first metal silicide is formed by reacting a first silicon layer and a metal layer that is in contact with the first silicon layer, wherein the second metal silicide is formed by reacting a second silicon layer and the metal layer that is in contact with second silicon layer, wherein the second layer is thicker than the first silicon layer, and wherein the second silicon layer is single layered or multi-layered.

16. A method of forming a semiconductor device, the method comprising:
providing a substrate including first and second regions;
forming a gate insulating layer on a surface of the substrate;
forming a first gate electrode formed of a first metal silicide on the gate insulating layer in the first region; and
forming a second gate electrode formed of a second metal silicide including a metal the same as that of the first metal silicide on the gate insulating layer of the second region, wherein the gate insulating layer is formed of an insulating material which brings about a Fermi pinning effect increasing or decreasing intrinsic work functions of the first and second metal silicides, and wherein the first gate electrode formed of the first metal silicide has a height that is less than a height of the second gate electrode formed of the second metal silicide, such that the first metal silicide has a lower silicon concentration than the second metal silicide so that the Fermi pinning effect provided to the first gate electrode is less effective than that provided to the second gate electrode.

17. The method as set forth in claim 16, wherein the first region is a region in which a PMOS transistor region is formed, and the second region is a region in which an NMOS transistor region is formed, and wherein the gate insulating layer brings about a Fermi pinning effect decreasing intrinsic work functions of the first and second metal silicides.

18. The method as set forth in claim 17, wherein an intrinsic work function of a metal included in the first and second metal silicides is larger than that of the first and second metal silicides.

19. The method as set forth in claim 16, wherein the first region is a region in which an NMOS transistor region is formed, and the second region is a region in which a PMOS transistor region is formed, and
wherein the gate insulating layer brings about a Fermi pinning effect increasing intrinsic work functions of the first and second metal silicides.

20. The method as set forth in claim 19, wherein an intrinsic work function of a metal included in the first and second metal silicides is smaller than that of the first and second metal silicides.

21. The method as set forth in claim 16, wherein forming the first and second gate electrodes comprises:
forming a first silicon pattern on the gate insulating layer of the first region and a second silicon pattern on the gate insulating layer of the second region;
forming a mold insulating layer enclosing the first and second silicon patterns on the substrate and exposing upper surfaces of the first and second silicon patterns;
selectively recessing the exposed first silicon pattern;
depositing a metal layer on a surface of the substrate;
forming the first gate electrode by reacting the recessed first silicon patterns and the metal layer through a complete silicidation process and forming the second gate electrode by reacting the second silicon patterns and the metal layer; and
removing an unreacted metal layer.

22. The method as set forth in claim 16, wherein forming the first and second gate electrodes comprises:
forming a first silicon pattern on the gate insulating layer of the first region and a second silicon pattern on the gate insulating layer of the second region;
forming a mold insulating layer enclosing the first and second silicon patterns on the substrate and exposing upper surfaces of the first and second silicon patterns;
sequentially depositing a metal layer and a subsidiary silicon layer on a surface of the substrate;
removing the subsidiary silicon layer of the first region such that the subsidiary silicon layer remains on the metal layer of the second region;
forming the first gate electrode by reacting the first silicon patterns and the metal layer through a complete silicidation process and forming the second gate electrode by reacting the second silicon patterns, the metal layer, and the subsidiary silicon layer; and
removing an unreacted metal layer of the first region and a residual material formed by the reaction of the metal layer and the subsidiary silicon layer on the mold insulating layer of the second region.

23. The method as set forth in claim 16, wherein the first metal silicide is formed by reacting a first silicon layer and a metal layer that is in contact with the first silicon layer, wherein the second metal silicide is formed by reacting a second silicon layer and the metal layer that is in contact with second silicon layer, wherein the second layer is thicker than the first silicon layer, and wherein the second silicon layer is single layered or multi-layered.

24. A semiconductor device comprising:
a substrate including a PMOS transistor and a NMOS transistor region;
a first gate electrode disposed on the substrate in the PMOS transistor region and formed of a first metal silicide;
a second gate electrode disposed on the substrate in the NMOS transistor region and formed of a second metal silicide including the same metal as that of the first metal silicide;
a gate insulating layer interposed between the substrate and the first gate electrode, and between the substrate and the second gate electrode,
wherein the gate insulating layer brings about a Fermi pinning effect decreasing an intrinsic work function of the first and second metal silicides,
wherein the first metal silicide has a lower silicon concentration that the second metal silicide so that the Fermi pinning effect provided to the first gate electrode is less effective than that provided to the second gate electrode, and wherein an intrinsic work function of a metal included in the first and second metal silicides is larger than that of the first and second metal silicides.

25. The semiconductor as set forth in claim 24, wherein the metal included in the first and second metal silicides is one of nickel, cobalt, and platinum.

26. The semiconductor as set forth in claim 24, wherein the gate insulating layer includes at least one material selected from the group consisting of hafnium oxide, hafnium silicate, zirconium oxide, and zirconium silicate.

* * * * *

UNITED STATES PATENT AND TRADEMARK OFFICE
CERTIFICATE OF CORRECTION

PATENT NO. : 7,397,095 B2 Page 1 of 1
APPLICATION NO. : 11/343388
DATED : July 8, 2008
INVENTOR(S) : Woo-Sik Kim

It is certified that error appears in the above-identified patent and that said Letters Patent is hereby corrected as shown below:

Column 12, line 33 delete "suicides" and insert --silicides--

Column 12, line 39 delete "hafluium" and insert --hafnium--

Signed and Sealed this

Third Day of February, 2009

JOHN DOLL
*Acting Director of the United States Patent and Trademark Office*